US010453828B1

(12) United States Patent
Ouderkirk et al.

(10) Patent No.: US 10,453,828 B1
(45) Date of Patent: Oct. 22, 2019

(54) FOVEATED RENDERING DISPLAY DEVICES AND METHODS OF MAKING THE SAME

(71) Applicant: Facebook Technologies, LLC, Menlo Park, CA (US)

(72) Inventors: Andrew John Ouderkirk, Redmond, WA (US); James Ronald Bonar, Redmond, WA (US); Jasmine Soria Sears, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/006,734

(22) Filed: Jun. 12, 2018

(51) Int. Cl.
| | | |
|---|---|---|
| *H01L 25/075* | (2006.01) | |
| *H01L 27/15* | (2006.01) | |
| *H01L 27/32* | (2006.01) | |
| *G06F 3/01* | (2006.01) | |
| *G02B 27/01* | (2006.01) | |
| *H01L 33/00* | (2010.01) | |

(52) U.S. Cl.
CPC ........ *H01L 25/0753* (2013.01); *H01L 27/156* (2013.01); *H01L 27/3244* (2013.01); *H01L 27/3281* (2013.01); *G02B 27/0176* (2013.01); *G02B 2027/015* (2013.01); *G02B 2027/0152* (2013.01); *G06F 3/013* (2013.01); *H01L 33/0045* (2013.01)

(58) Field of Classification Search
CPC ............. H01L 25/0753; H01L 27/3281; H01L 27/156; H01L 33/0045
See application file for complete search history.

(56) References Cited

U.S. PATENT DOCUMENTS

| | | | | |
|---|---|---|---|---|
| 2003/0210222 A1* | 11/2003 | Ogiwara | .............. | G02B 6/0036 345/103 |
| 2018/0045385 A1* | 2/2018 | Tyukhova | .......... | H05B 33/0872 |
| 2018/0335668 A1* | 11/2018 | Fan | .................. | G02F 1/133602 |

* cited by examiner

*Primary Examiner* — Dung A. Le
(74) *Attorney, Agent, or Firm* — Morgan, Lewis & Bockius LLP

(57) ABSTRACT

A display device includes a display panel having a first emission region, a second emission region, and a third emission region. The first emission region is surrounded by the second emission region and the second emission region is surrounded by the third emission region. The display panel includes a plurality of light emitters arranged in the first emission region, the second emission region, and the third emission region, respective light emitters of the plurality of light emitters configured to emit light. The first emission region has a first density of light emitters, the second emission region has a second density of light emitters that is less than the first density and the third emission region has a third density of light emitters that is less than the second density.

19 Claims, 10 Drawing Sheets

1010 Arranging a plurality of light emitters in a first emission region, a second emission region, and a third emission region of a display panel, the first emission region is surrounded by the second emission region that is distinct from and mutually exclusive to the first emission region and the second emission region is surrounded by the third emission region that is distinct from and mutually exclusive to the first emission region and the second emission region.

Respective light emitters of the plurality of light emitters for the first emission region, the second emission region, and the third emission region are configured to emit light. The first emission region has a first density of light emitters, the second emission region has a second density of light emitters that is less than the first density, and the third emission region has a third density of light emitters that is less than the second density

Figure 10

FOVEATED RENDERING DISPLAY DEVICES AND METHODS OF MAKING THE SAME

TECHNICAL FIELD

This relates generally to head-mounted display devices, and more specifically to optical components used in head-mounted display devices.

BACKGROUND

Head-mounted display devices (also called herein head-mounted displays) are gaining popularity as means for providing visual information to users.

However, a significant portion of power used for operating a head-mounted display device is used for (i) computation needed to render high-resolution images and (ii) conversion of electrical energy to light for displaying the rendered images.

In some cases, head-mounted display devices include large batteries to provide sufficient power for operating the head-mounted display devices, which, in turn, increase the size and weight of the head-mounted display devices.

SUMMARY

Accordingly, there is a need for head-mounted display devices with low power consumption, which reduces the need for large-size batteries. This, in turn, reduces the size and weight of head-mounted display devices, thereby enhancing the user experience with such devices.

The above deficiencies and other problems are reduced or eliminated by the disclosed devices, systems, and methods.

In accordance with some embodiments, a display device includes a display panel that has a first emission region, a second emission region that is distinct from and mutually exclusive to the first emission region and a third emission region is distinct from and mutually exclusive to the first emission region and the second emission region. The first emission region is surrounded by the second emission region and the second emission region is surrounded by the third emission region. The display panel includes a plurality of light emitters arranged in the first emission region, the second emission region, and the third emission region, respective light emitters of the plurality of light emitters configured to emit light, the first emission region has a first density of light emitters, the second emission region has a second density of light emitters that is less than the first density and the third emission region has a third density of light emitters that is less than the second density.

In accordance with some embodiments, a method for making a display panel includes arranging, in a first emission region of the display panel, a plurality of light emitters to have a first density; arranging, in a second emission region of the display panel, a plurality of light emitters to have a second density; and arranging, in the third emission region of the display panel, a plurality of light emitters to have a third density. The second emission region surrounds the first emission region and is distinct from and mutually exclusive to the first emission region. The second density is less than the first density. The third emission region surrounds the second emission region and is distinct from and mutually exclusive to the first emission region and the second emission region. The third density is less than the second density. Respective light emitters of the plurality of light emitters for the first emission region, the second emission region, and the third emission region are configured to emit light.

Thus, the disclosed embodiments provide devices and methods that reduce power consumption.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

FIG. 10 is a flow diagram illustrating a method for making a display panel in accordance with some embodiments.

Figure 1:
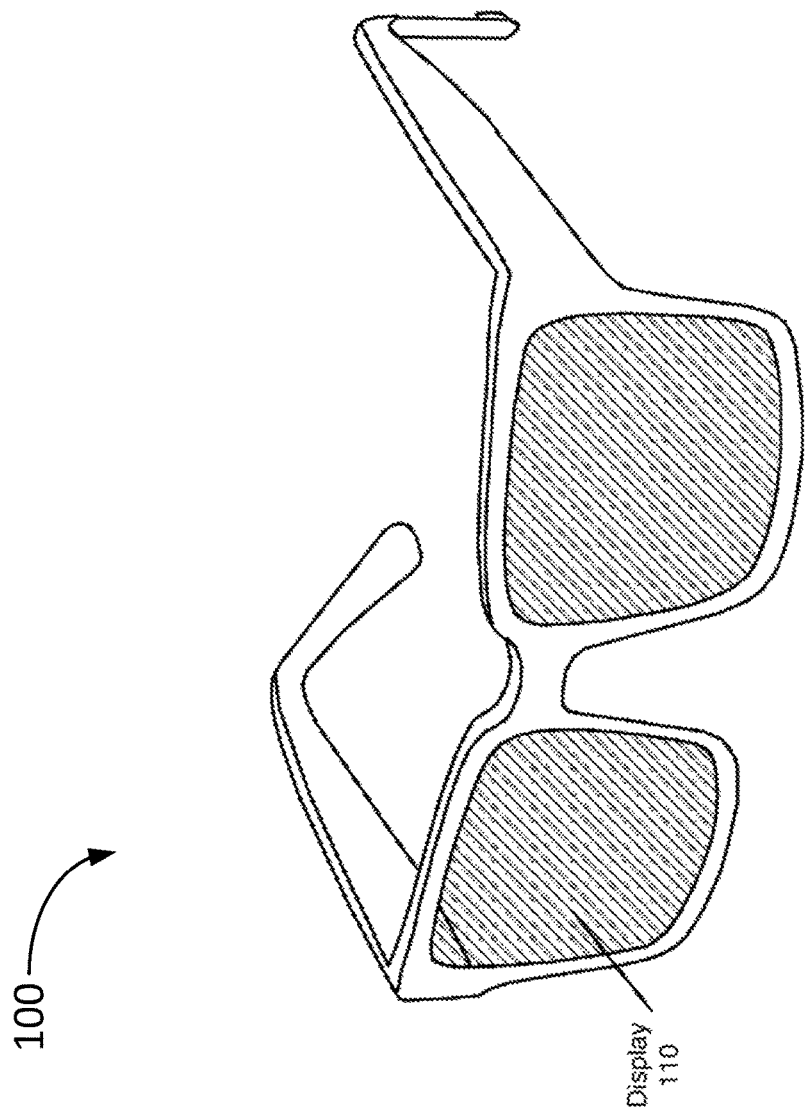
FIG. 1 is a perspective view of a display device in accordance with some embodiments.

These figures are not drawn to scale unless indicated otherwise.

DETAILED DESCRIPTION

Large and heavy head-mounted display devices have limited applications. Accordingly, there is a need for head-mounted display devices that are compact and light, which, in turn, enhance user experience with such devices.

Human eyes have a non-uniform resolution across a field of vision. For example, a human eye typically has a high resolution around a fovea of the eye, and the resolution rapidly decreases toward a peripheral area of a retina of the eye. To reduce the power consumption of head-mounted display devices, displays with multiple regions of different densities are used. For example, a display that has a high resolution in a central region of the display and a low resolution in a peripheral region of the display has lower power consumption than conventional uniform density displays, because the amount of computation needed to render images is reduced and large and efficient light emitters can be used for the peripheral region.

Reference will now be made to embodiments, examples of which are illustrated in the accompanying drawings. In the following description, numerous specific details are set forth in order to provide an understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

It will also be understood that, although the terms first, second, etc. are, in some instances, used herein to describe various elements, these elements should not be limited by these terms. These terms are used only to distinguish one element from another. For example, a first region could be termed a second region, and, similarly, a second region could be termed a first region, without departing from the scope of the various described embodiments. The first region and the second region are both regions, but they are not the same region.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "exemplary" is used herein in the sense of "serving as an example, instance, or illustration" and not in the sense of "representing the best of its kind."

Embodiments described herein may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HIVID, a mobile device or computing system, or any other hardware platform capable of providing artificial reality content to one or more viewers.

FIG. 1 illustrates display device 100 in accordance with some embodiments. In some embodiments, display device 100 is configured to be worn on a head of a user (e.g., by having the form of spectacles or eyeglasses, as shown in FIG. 1) or to be included as part of a helmet that is to be worn by the user. When display device 100 is configured to be worn on a head of a user or to be included as part of a helmet, display device 100 is called a head-mounted display. Alternatively, display device 100 is configured for placement in proximity of an eye or eyes of the user at a fixed location, without being head-mounted (e.g., display device 100 is mounted in a vehicle, such as a car or an airplane, for placement in front of an eye or eyes of the user). As shown in FIG. 1, display device 100 includes display 110. Display 110 is configured for presenting visual contents (e.g., augmented reality contents, virtual reality contents, mixed reality contents, or any combination thereof) to a user.

In some embodiments, display device 100 includes one or more components described below with respect to FIG. 2. In some embodiments, display device 100 includes additional components not shown in FIG. 2.

Figure 2:
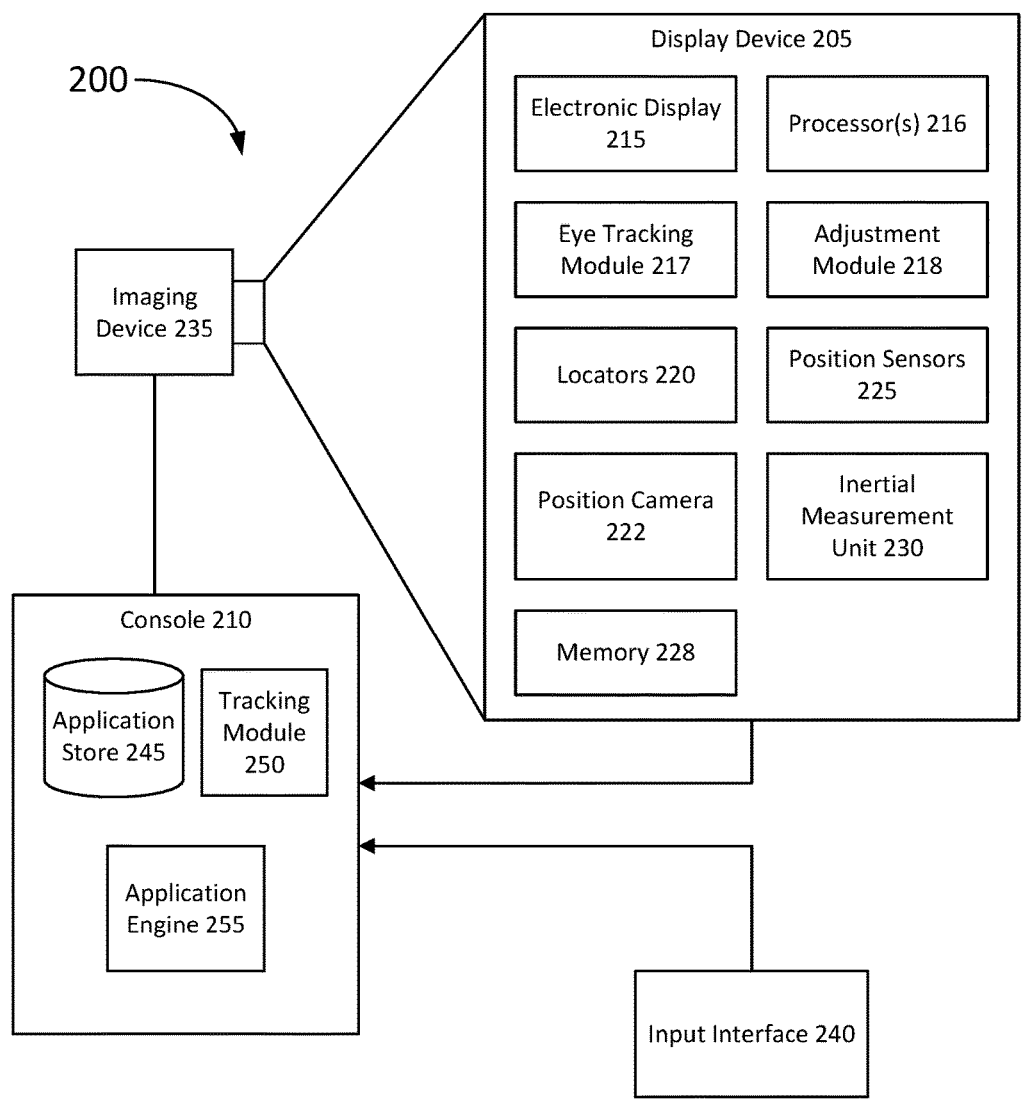
FIG. 2 is a block diagram of a system including a display device in accordance with some embodiments.

FIG. 2 is a block diagram of system 200 in accordance with some embodiments. The system 200 shown in FIG. 2 includes display device 205 (which corresponds to display device 100 shown in FIG. 1), imaging device 235, and input interface 240 that are each coupled to console 210. While FIG. 2 shows an example of system 200 including one display device 205, imaging device 235, and input interface 240, in other embodiments, any number of these components may be included in system 200. For example, there may be multiple display devices 205 each having associated input interface 240 and being monitored by one or more imaging devices 235, with each display device 205, input interface 240, and imaging devices 235 communicating with console 210. In alternative configurations, different and/or additional components may be included in system 200. For example, in some embodiments, console 210 is connected via a network (e.g., the Internet) to system 200 or is self-contained as part of display device 205 (e.g., physically located inside display device 205). In some embodiments, display device 205 is used to create mixed reality by adding in a view of the real surroundings. Thus, display device 205 and system 200 described here can deliver virtual reality, mixed reality, and augmented reality.

In some embodiments, as shown in FIG. 1, display device 205 is a head-mounted display that presents media to a user. Examples of media presented by display device 205 include one or more images, video, audio, or some combination thereof. In some embodiments, audio is presented via an external device (e.g., speakers and/or headphones) that receives audio information from display device 205, console 210, or both, and presents audio data based on the audio information. In some embodiments, display device 205 immerses a user in a virtual environment.

In some embodiments, display device 205 also acts as an augmented reality (AR) headset. In these embodiments, display device 205 augments views of a physical, real-world environment with computer-generated elements (e.g., images, video, sound, etc.). Moreover, in some embodiments, display device 205 is able to cycle between different types of operation. Thus, display device 205 operate as a virtual reality (VR) device, an AR device, as glasses or some combination thereof (e.g., glasses with no optical correction, glasses optically corrected for the user, sunglasses, or some combination thereof) based on instructions from application engine 255.

Display device 205 includes electronic display 215, one or more processors 216, eye tracking module 217, adjustment module 218, one or more locators 220, one or more position sensors 225, one or more position cameras 222, memory 228, inertial measurement unit (IMU) 230, or a subset or superset thereof (e.g., display device 205 with electronic display 215, one or more processors 216, and memory 228, without any other listed components). Some embodiments of display device 205 have different modules than those described here. Similarly, the functions can be distributed among the modules in a different manner than is described here.

One or more processors 216 (e.g., processing units or cores) execute instructions stored in memory 228. Memory 228 includes high-speed random access memory, such as DRAM, SRAM, DDR RAM or other random access solid state memory devices; and may include non-volatile memory, such as one or more magnetic disk storage devices, optical disk storage devices, flash memory devices, or other non-volatile solid state storage devices. Memory 228, or alternately the non-volatile memory device(s) within memory 228, includes a non-transitory computer readable storage medium. In some embodiments, memory 228 or the computer readable storage medium of memory 228 stores programs, modules and data structures, and/or instructions for displaying one or more images on electronic display 215.

Electronic display 215 displays images to the user in accordance with data received from console 210 and/or processor(s) 216. In various embodiments, electronic display 215 may comprise a single adjustable electronic display element or multiple adjustable electronic displays elements (e.g., a display for each eye of a user).

In some embodiments, the display element includes one or more light emission devices and a corresponding array of emission intensity array. An emission intensity array is an array of electro-optic pixels, opto-electronic pixels, some other array of devices that dynamically adjust the amount of light transmitted by each device, or some combination thereof. These pixels are placed behind one or more lenses. In some embodiments, the emission intensity array is an array of liquid crystal based pixels in an LCD (a Liquid Crystal Display). Examples of the light emission devices include: an organic light emitting diode, an active-matrix organic light-emitting diode, a light emitting diode, some type of device capable of being placed in a flexible display, or some combination thereof. The light emission devices include devices that are capable of generating visible light (e.g., red, green, blue, etc.) used for image generation. The emission intensity array is configured to selectively attenuate individual light emission devices, groups of light emission devices, or some combination thereof. Alternatively, when the light emission devices are configured to selectively attenuate individual emission devices and/or groups of light emission devices, the display element includes an array of such light emission devices without a separate emission intensity array.

One or more lenses direct light from the arrays of light emission devices (optionally through the emission intensity arrays) to locations within each eyebox and ultimately to the back of the user's retina(s). An eyebox is a region that is occupied by an eye of a user located proximity to display device 205 (e.g., a user wearing display device 205) for viewing images from display device 205. In some cases, the eyebox is represented as a 10 mm×10 mm square. In some embodiments, the one or more lenses include one or more coatings, such as anti-reflective coatings.

In some embodiments, the display element includes an infrared (IR) detector array that detects IR light that is retro-reflected from the retinas of a viewing user, from the surface of the corneas, lenses of the eyes, or some combination thereof. The IR detector array includes an IR sensor or a plurality of IR sensors that each correspond to a different position of a pupil of the viewing user's eye. In alternate embodiments, other eye tracking systems may also be employed.

Eye tracking module 217 determines locations of each pupil of a user's eyes. In some embodiments, eye tracking module 217 instructs electronic display 215 to illuminate the eyebox with IR light (e.g., via IR emission devices in the display element).

A portion of the emitted IR light will pass through the viewing user's pupil and be retro-reflected from the retina toward the IR detector array, which is used for determining the location of the pupil. Alternatively, the reflection off of the surfaces of the eye is used to also determine location of the pupil. The IR detector array scans for retro-reflection and identifies which IR emission devices are active when retro-reflection is detected. Eye tracking module 217 may use a tracking lookup table and the identified IR emission devices to determine the pupil locations for each eye. The tracking lookup table maps received signals on the IR detector array to locations (corresponding to pupil locations) in each eyebox. In some embodiments, the tracking lookup table is generated via a calibration procedure (e.g., user looks at various known reference points in an image and eye tracking module 217 maps the locations of the user's pupil while looking at the reference points to corresponding signals received on the IR tracking array). As mentioned above, in some embodiments, system 200 may use other eye tracking systems than the embedded IR one described above.

Adjustment module 218 generates an image frame based on the determined locations of the pupils. In some embodiments, this sends a discrete image to the display that will tile subimages together thus a coherent stitched image will appear on the back of the retina. Adjustment module 218 adjusts an output (i.e. the generated image frame) of electronic display 215 based on the detected locations of the pupils. Adjustment module 218 instructs portions of electronic display 215 to pass image light to the determined locations of the pupils. In some embodiments, adjustment module 218 also instructs the electronic display to not pass image light to positions other than the determined locations of the pupils. Adjustment module 218 may, for example, block and/or stop light emission devices whose image light falls outside of the determined pupil locations, allow other light emission devices to emit image light that falls within the determined pupil locations, translate and/or rotate one or more display elements, dynamically adjust curvature and/or refractive power of one or more active lenses in the lens (e.g., microlens) arrays, or some combination thereof.

Optional locators 220 are objects located in specific positions on display device 205 relative to one another and relative to a specific reference point on display device 205. A locator 220 may be a light emitting diode (LED), a corner cube reflector, a reflective marker, a type of light source that contrasts with an environment in which display device 205 operates, or some combination thereof. In embodiments where locators 220 are active (i.e., an LED or other type of light emitting device), locators 220 may emit light in the visible band (e.g., about 400 nm to 750 nm), in the infrared band (e.g., about 750 nm to 1 mm), in the ultraviolet band (about 100 nm to 400 nm), some other portion of the electromagnetic spectrum, or some combination thereof.

In some embodiments, locators 220 are located beneath an outer surface of display device 205, which is transparent to the wavelengths of light emitted or reflected by locators 220 or is thin enough to not substantially attenuate the wavelengths of light emitted or reflected by locators 220. Additionally, in some embodiments, the outer surface or other portions of display device 205 are opaque in the visible band of wavelengths of light. Thus, locators 220 may emit light in the IR band under an outer surface that is transparent in the IR band but opaque in the visible band.

IMU 230 is an electronic device that generates calibration data based on measurement signals received from one or more position sensors 225. Position sensor 225 generates one or more measurement signals in response to motion of display device 205. Examples of position sensors 225 include: one or more accelerometers, one or more gyroscopes, one or more magnetometers, another suitable type of sensor that detects motion, a type of sensor used for error correction of IMU 230, or some combination thereof. Position sensors 225 may be located external to IMU 230, internal to IMU 230, or some combination thereof.

Based on the one or more measurement signals from one or more position sensors 225, IMU 230 generates first calibration data indicating an estimated position of display device 205 relative to an initial position of display device 205. For example, position sensors 225 include multiple accelerometers to measure translational motion (forward/back, up/down, left/right) and multiple gyroscopes to measure rotational motion (e.g., pitch, yaw, roll). In some embodiments, IMU 230 rapidly samples the measurement signals and calculates the estimated position of display device 205 from the sampled data. For example, IMU 230 integrates the measurement signals received from the accelerometers over time to estimate a velocity vector and integrates the velocity vector over time to determine an estimated position of a reference point on display device 205. Alternatively, IMU 230 provides the sampled measurement signals to console 210, which determines the first calibration data. The reference point is a point that may be used to describe the position of display device 205. While the reference point may generally be defined as a point in space; however, in practice the reference point is defined as a point within display device 205 (e.g., a center of IMU 230).

In some embodiments, IMU 230 receives one or more calibration parameters from console 210. As further discussed below, the one or more calibration parameters are used to maintain tracking of display device 205. Based on a received calibration parameter, IMU 230 may adjust one or more IMU parameters (e.g., sample rate). In some embodiments, certain calibration parameters cause IMU 230 to update an initial position of the reference point so it corresponds to a next calibrated position of the reference point. Updating the initial position of the reference point as the next calibrated position of the reference point helps reduce accumulated error associated with the determined estimated position. The accumulated error, also referred to as drift error, causes the estimated position of the reference point to "drift" away from the actual position of the reference point over time.

Imaging device 235 generates calibration data in accordance with calibration parameters received from console 210. Calibration data includes one or more images showing observed positions of locators 220 that are detectable by imaging device 235. In some embodiments, imaging device 235 includes one or more still cameras, one or more video cameras, any other device capable of capturing images including one or more locators 220, or some combination thereof. Additionally, imaging device 235 may include one or more filters (e.g., used to increase signal to noise ratio). Imaging device 235 is configured to optionally detect light emitted or reflected from locators 220 in a field of view of imaging device 235. In embodiments where locators 220 include passive elements (e.g., a retroreflector), imaging device 235 may include a light source that illuminates some or all of locators 220, which retro-reflect the light towards the light source in imaging device 235. Second calibration data is communicated from imaging device 235 to console 210, and imaging device 235 receives one or more calibration parameters from console 210 to adjust one or more imaging parameters (e.g., focal length, focus, frame rate, ISO, sensor temperature, shutter speed, aperture, etc.).

Input interface 240 is a device that allows a user to send action requests to console 210. An action request is a request to perform a particular action. For example, an action request may be to start or end an application or to perform a particular action within the application. Input interface 240 may include one or more input devices. Example input devices include: a keyboard, a mouse, a game controller, data from brain signals, data from other parts of the human body, or any other suitable device for receiving action requests and communicating the received action requests to console 210. An action request received by input interface 240 is communicated to console 210, which performs an action corresponding to the action request. In some embodiments, input interface 240 may provide haptic feedback to the user in accordance with instructions received from console 210. For example, haptic feedback is provided when an action request is received, or console 210 communicates instructions to input interface 240 causing input interface 240 to generate haptic feedback when console 210 performs an action.

Console 210 provides media to display device 205 for presentation to the user in accordance with information received from one or more of: imaging device 235, display device 205, and input interface 240. In the example shown in FIG. 2, console 210 includes application store 245, tracking module 250, and application engine 255. Some embodiments of console 210 have different modules than those described in conjunction with FIG. 2. Similarly, the functions further described below may be distributed among components of console 210 in a different manner than is described here.

When application store 245 is included in console 210, application store 245 stores one or more applications for execution by console 210. An application is a group of instructions, that when executed by a processor, is used for generating content for presentation to the user. Content generated by the processor based on an application may be in response to inputs received from the user via movement of display device 205 or input interface 240. Examples of applications include: gaming applications, conferencing applications, video playback application, or other suitable applications.

When tracking module 250 is included in console 210, tracking module 250 calibrates system 200 using one or more calibration parameters and may adjust one or more calibration parameters to reduce error in determination of the position of display device 205. For example, tracking module 250 adjusts the focus of imaging device 235 to obtain a more accurate position for observed locators on display device 205. Moreover, calibration performed by tracking module 250 also accounts for information received from IMU 230. Additionally, if tracking of display device 205 is lost (e.g., imaging device 235 loses line of sight of at least a threshold number of locators 220), tracking module 250 re-calibrates some or all of system 200.

In some embodiments, tracking module 250 tracks movements of display device 205 using second calibration data from imaging device 235. For example, tracking module 250 determines positions of a reference point of display device 205 using observed locators from the second calibration data and a model of display device 205. In some embodiments, tracking module 250 also determines positions of a reference point of display device 205 using position information from the first calibration data. Additionally, in some embodiments, tracking module 250 may use portions of the first calibration data, the second calibration data, or some combination thereof, to predict a future location of display device 205. Tracking module 250 provides the estimated or predicted future position of display device 205 to application engine 255.

Application engine 255 executes applications within system 200 and receives position information, acceleration information, velocity information, predicted future positions, or some combination thereof of display device 205 from tracking module 250. Based on the received information, application engine 255 determines content to provide to display device 205 for presentation to the user. For example, if the received information indicates that the user has looked to the left, application engine 255 generates content for display device 205 that mirrors the user's movement in a virtual environment. Additionally, application engine 255 performs an action within an application executing on console 210 in response to an action request received from input interface 240 and provides feedback to the user that the action was performed. The provided feedback may be visual or audible feedback via display device 205 or haptic feedback via input interface 240.

Figure 3:
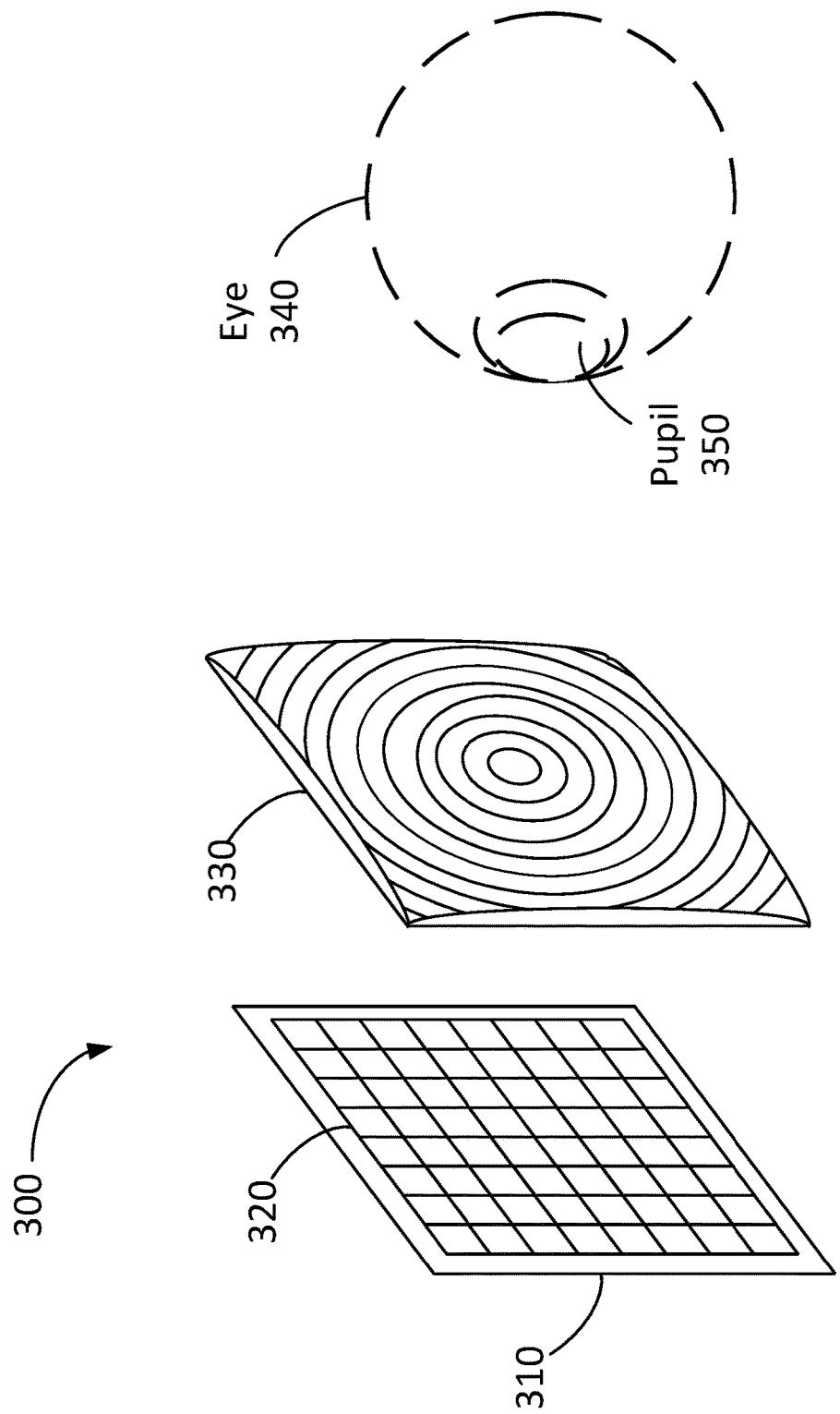
FIG. 3 is an isometric view of a display device in accordance with some embodiments.

FIG. 3 is an isometric view of display device 300 in accordance with some embodiments. In some other embodiments, display device 300 is part of some other electronic display (e.g., digital microscope, etc.). In some embodiments, display device 300 includes light emission device array 310 and one or more lenses 330. In some embodiments, display device 300 also includes an emission intensity array and an IR detector array.

Light emission device array 310 emits image light and optional IR light toward the viewing user. Light emission device array 310 may be, e.g., an array of LEDs, an array of microLEDs, an array of OLEDs, or some combination thereof. Light emission device array 310 includes light emission devices 320 that emit light in the visible light (and optionally includes devices that emit light in the IR). In some embodiments, a microLED includes an LED with an emission area characterized by a representative dimension (e.g., a diameter, a width, a height, etc.) of 100 µm or less (e.g., 50 µm, 20 µm, etc.). In some embodiments, a microLED has an emission area having a shape of a circle or a rectangle.

The emission intensity array is configured to selectively attenuate light emitted from light emission array 310. In some embodiments, the emission intensity array is composed of a plurality of liquid crystal cells or pixels, groups of light emission devices, or some combination thereof. Each of the liquid crystal cells is, or in some embodiments, groups of liquid crystal cells are, addressable to have specific levels of attenuation. For example, at a given time, some of the liquid crystal cells may be set to no attenuation, while other liquid crystal cells may be set to maximum attenuation. In this manner the emission intensity array is able to control what portion of the image light emitted from light emission device array 310 is passed to the one or more lenses 330. In some embodiments, display device 300 uses the emission intensity array to facilitate providing image light to a location of pupil 350 of eye 340 of a user, and minimize the amount of image light provided to other areas in the eyebox.

One or more lenses 330 receive the modified image light (e.g., attenuated light) from the emission intensity array (or directly from emission device array 310), and shifted by one or more beam shifters 360, and direct the shifted image light to a location of pupil 350.

An optional IR detector array detects IR light that has been retro-reflected from the retina of eye 340, a cornea of eye 340, a crystalline lens of eye 340, or some combination thereof. The IR detector array includes either a single IR sensor or a plurality of IR sensitive detectors (e.g., photodiodes). In some embodiments, the IR detector array is separate from light emission device array 310. In some embodiments, the IR detector array is integrated into light emission device array 310.

In some embodiments, light emission device array 310 and the emission intensity array make up a display element. Alternatively, the display element includes light emission device array 310 (e.g., when light emission device array 310 includes individually adjustable pixels) without the emission intensity array. In some embodiments, the display element additionally includes the IR array. In some embodiments, in response to a determined location of pupil 350, the display element adjusts the emitted image light such that the light output by the display element is refracted by one or more lenses 330 toward the determined location of pupil 350, and not toward other locations in the eyebox.

A significant portion of power used for operating a head-mounted display device is used for (i) computation needed to render high-resolution images and (ii) conversion of electrical energy to light for displaying the rendered images. Human eyes have a non-uniform resolution across a field of vision. For example, a human eye typically has a high resolution around a fovea of the eye, and the resolution rapidly decreases toward a peripheral area of a retina of the eye. To reduce the power consumption of head-mounted display devices, displays with multiple regions of different densities are used. A high resolution region is used for providing a high resolution image to the fovea of the eye, and a low resolution region is used for providing a low resolution image to the peripheral area of the retina of the eye (which, however, does not impact the perceived resolution, as the peripheral area of the retina of the eye has a low resolution). The low resolution region consumes less power than the high resolution region for a same unit area.

Figure 4:
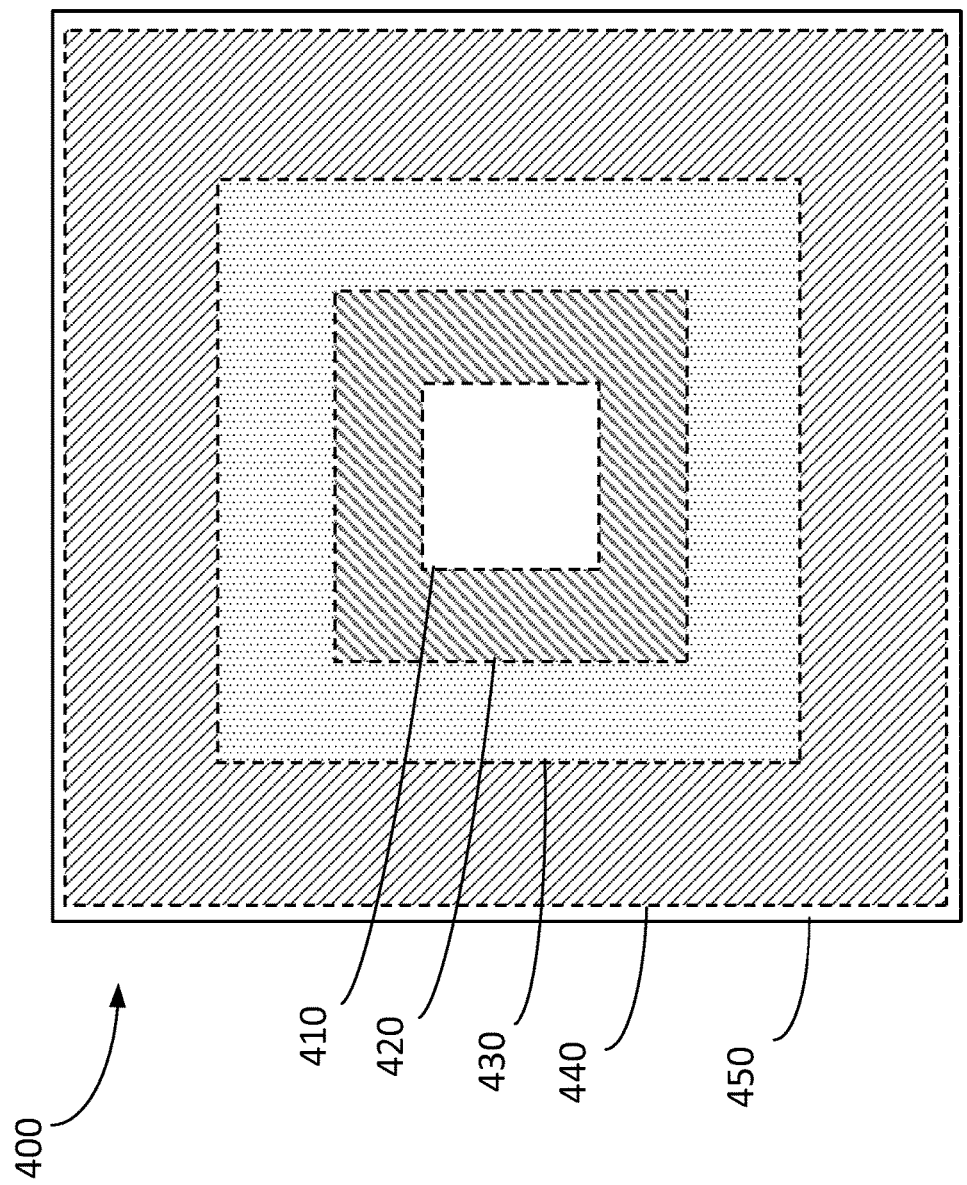
FIG. 4 illustrates a display panel in accordance with some embodiments.

FIG. 4 illustrates a display panel 400 in accordance with some embodiments.

In some embodiments, the display panel 400 corresponds to the light emission device array 310 shown in FIG. 3. In some embodiments, the display panel 400 is coupled with a circuit board 450. The display panel 400 includes a first emission region 410, a second emission region 420, a third emission region 430, and a fourth emission region 440. Although FIG. 4 illustrates the display panel 400 having four emission regions, the display panel 400 is not limited to having four emission regions, but rather may have fewer or more emission regions (e.g., at least 2, 3, 5, 6, or 7 regions, etc.).

In some cases, the first emission region 410 is configured to provide light to a fovea of a user's eye and the other emission regions (e.g., the second emission region 420, the third emission region 430, and the fourth emission region 440) is configured to provide light to a peripheral-vision area of the user's eye. The second emission region 420 is distinct from and mutually exclusive to the first emission region 410 and the third emission region 430 is distinct from and mutually exclusive to the second emission region 420. The fourth emission region 440 is distinct from and mutually exclusive to the third emission region 430.

In FIG. 4, the first emission region 410 is surrounded by the second emission region 420, the second emission region 420 is surrounded by the third emission region 430 and the third emission region 430 is surrounded by the fourth emission region 440.

In some embodiments, the first emission region 410 is no more than 50% of the total area of the display panel 400, less than 20%, less than 10%, and less than 5% of the area of the display panel 400.

In some embodiments, the second emission region 420 is in contact with the first emission region 410, and the third emission region 430 is in contact with the second emission region 420. In some embodiments, the fourth emission region 440 is in contact with the third emission region 430.

In some embodiments, the third emission region 430 is distinct and separate from the first emission region 410. In some embodiments, the fourth emission region 440 is distinct and separate from the first emission region 410 and the second emission region 420.

In some embodiments, the display panel 400 includes a plurality of light emitters arranged in the first emission region 410, the second emission region 420, the third emission region 430, and the fourth emission region 440 (e.g., multiple light emitters are arranged in the first emission region 410, multiple light emitters are arranged in the second emission region 420, multiple light emitters are arranged in the third emission region 430, and multiple light emitters are arranged in the fourth emission region 440).

In some embodiments, the plurality of light emitters is individually addressable. In some embodiments, the light emitters are arranged in a respective emission region in an array (e.g., a rectangular array, a honeycomb array, etc.). In order to provide different resolutions in different emission regions, each emission region has a different density of light emitters. In some embodiments, the first emission region 410 has a first density of light emitters, the second emission region 420 has a second density of light emitters that is less than the first density, and the third emission region 430 has a third density of light emitters that is less than the second density. In some embodiments, the fourth emission region 440 has a fourth density of light emitters that is less than the third density.

In some embodiments, the first density is at least 50% higher than the second density. In some embodiments, the first density is at least 75% higher than the second density. In some embodiments, the first density is at least 100% higher than the second density.

In some embodiments, the second density is at least 50% higher than the third density. In some embodiments, the second density is at least 75% higher than the third density. In some embodiments, the second density is at least 100% higher than the third density.

In some embodiments, the third density is at least 50% higher than the fourth density. In some embodiments, the third density is at least 75% higher than the fourth density. In some embodiments, the third density is at least 100% higher than the fourth density.

In some embodiments, for any pair of emission regions selected from the plurality of emission regions in the display panel, an inner emission region of the pair of emission regions has a density of light emitters that is higher than a density of light emitters of an outer emission region of the pair of emission regions, the inner emission region being surrounded by the outer emission region.

In some embodiments, a ratio of the first density to the fourth density is at least 1.5, at least 2:1, at least 5:1, or at least 10:1. In some embodiments, a ratio of the first density to the third density is at least 1.5, at least 2:1, at least 5:1, or at least 10:1.

In some embodiments, a resolution of the display panel 400 decreases gradually from at least one emission region of the display panel to another. For example, in some cases, the first density of the first emission region 410 has the highest resolution among the plurality of emission regions, the second density of the second emission region 420 is at least 80%, 90%, or 95% of the first density, and the third density of the third emission region 430 is at least 80%, 90%, or 95% of the second density. In some embodiments, the fourth density of the fourth emission region 440 is at least 80%, 90%, or 95% of the third density.

In some embodiments, the display panel 400 includes ten or more emission regions, for any pair of adjacent emission regions selected from the ten or more emission regions, an outer emission region of the pair of adjacent emission regions has a density of light emitters that is at least 80%, 90%, or 95% of a density of light emitters of an inner emission region of the pair of adjacent emission regions. In some embodiments, the densities of the emission regions are selected so that boundaries of the emission regions are not visually perceivable (e.g., a ratio of densities of two adjacent emission regions is less than a predefined threshold).

Figure 5:
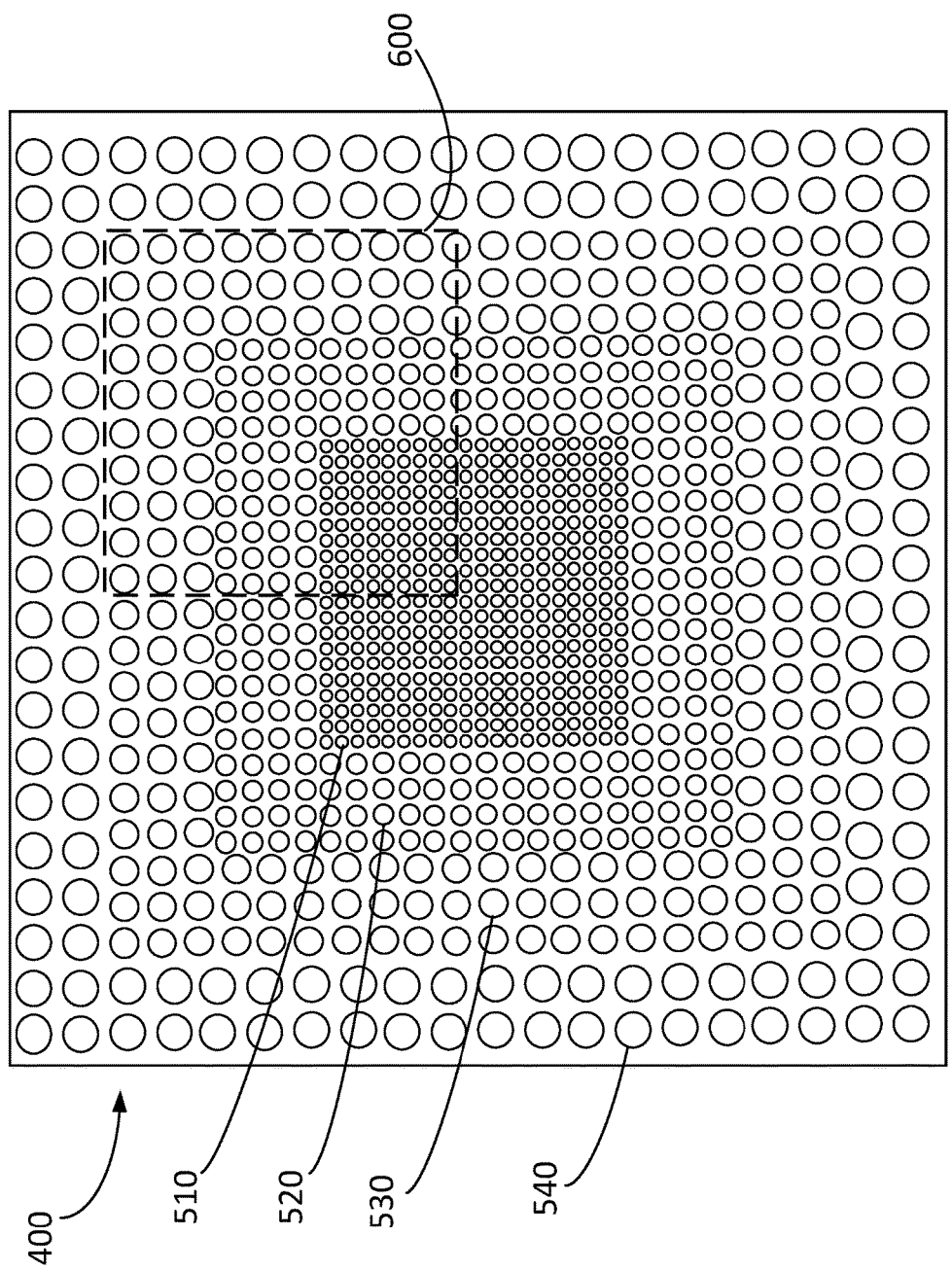
FIG. 5 illustrates a plurality of light emitters located in a plurality of emission regions of a display panel in accordance with some embodiments.

FIG. 5 illustrates a plurality of light emitters located in a plurality of emission regions in a display panel (e.g., the display panel 400 shown in FIG. 4) in accordance with some embodiments.

As shown in FIG. 5, light emitters are arranged with a different density in each of the first, second, third, and fourth emission regions of the display panel 400. Light emitters 510 are arranged in the first emission region, light emitters 520 are arranged in the second emission region, and light emitters 530 are arranged in the third emission region. Light emitters 540 are arranged in the fourth emission region.

As shown in FIG. 5, in some embodiments, a light emitter 510 in the first emission region is smaller than a light emitter 520 in the second emission region, a light emitter 530 in the third emission region, and a light emitter 540 in the fourth emission region. In some embodiments, the light emitter 520 in the second emission region is smaller than the light emitter 530 in the third emission region and the light emitter 540 in the fourth emission region. In some embodiments, the light emitter 530 in the third emission region is smaller than the light emitter 540 in the fourth emission region.

In some embodiments, each of the plurality of emitters has a same emission area.

In some embodiments, an emission area of an emitter increases with the reduction in a density of the plurality of emission regions, thereby maintaining a perceived brightness uniformly across the field of view. In some embodiments, for any pair of emission regions in the display panel 400, a light emitter in the inner emission region of the pair of emission regions has an emission area that is smaller than an emission area of a light emitter in the outer emission region surrounding the inner region while the inner emission region has a higher density than the outer emission region. For example, as shown in FIG. 5, in some embodiments, the first emission region has a higher density than the second emission region, and the light emitter 510 in the first emission region have an emission area that is less than an emission area of the light emitter 520 in the second emission region. In some embodiments, the emission area of the light emitter 520 in the second emission region is less than an emission area of the light emitter 530 in the third emission region. In some embodiments, the emission area of the light emitter 530 in the third emission region is less than an emission area of the light emitter 540 in the fourth emission region. In some embodiments, the emission area of the light emitter 510 in the first emission region is less than 50%, 20%, 10%, or 5% of the emission area of the light emitter 540 in the fourth emission region. In some embodiments, the emission area of the light emitter 510 in the first emission region is less than 50%, 20%, 10%, or 5% of the emission area of the light emitter 530 in the third emission region.

The plurality of light emitters in accordance with some embodiments is based on organic light-emitting diodes (OLEDs), light-emitting diodes (LEDs), superluminescent LEDs (SLEDs), LD, or vertical cavity surface emitting lasers (VCSELs), or any combination thereof. The display device in accordance with some embodiments is monochromatic, or has two, three (e.g. RGB), or four colors (e.g. RGBY or RGBW), or more. In some embodiments, the display device is a combination of color emitters with IR emitters. In some embodiments, the display device is a combination of color emitters with ultraviolet (UV) emitters. In some embodiments, a respective light emitter of the plurality of light emitters includes a first sub-pixel corresponding to a first color (e.g., red) and a second sub-pixel that is distinct from the first sub-pixel, corresponding to a second color (e.g., blue) that is distinct from the first color. In some embodiments, the respective light emitter includes a third sub-pixel, that is distinct from the first sub-pixel and the second sub-pixel, corresponding to a third color (e.g., green) that is distinct from the first color and the second color.

As described above, in some embodiments, each emission region has a different density of light emitters. A box 600 illustrated in FIG. 5 indicates a portion of the display panel 400 that is shown in detail in FIG. 6.

Figure 6:
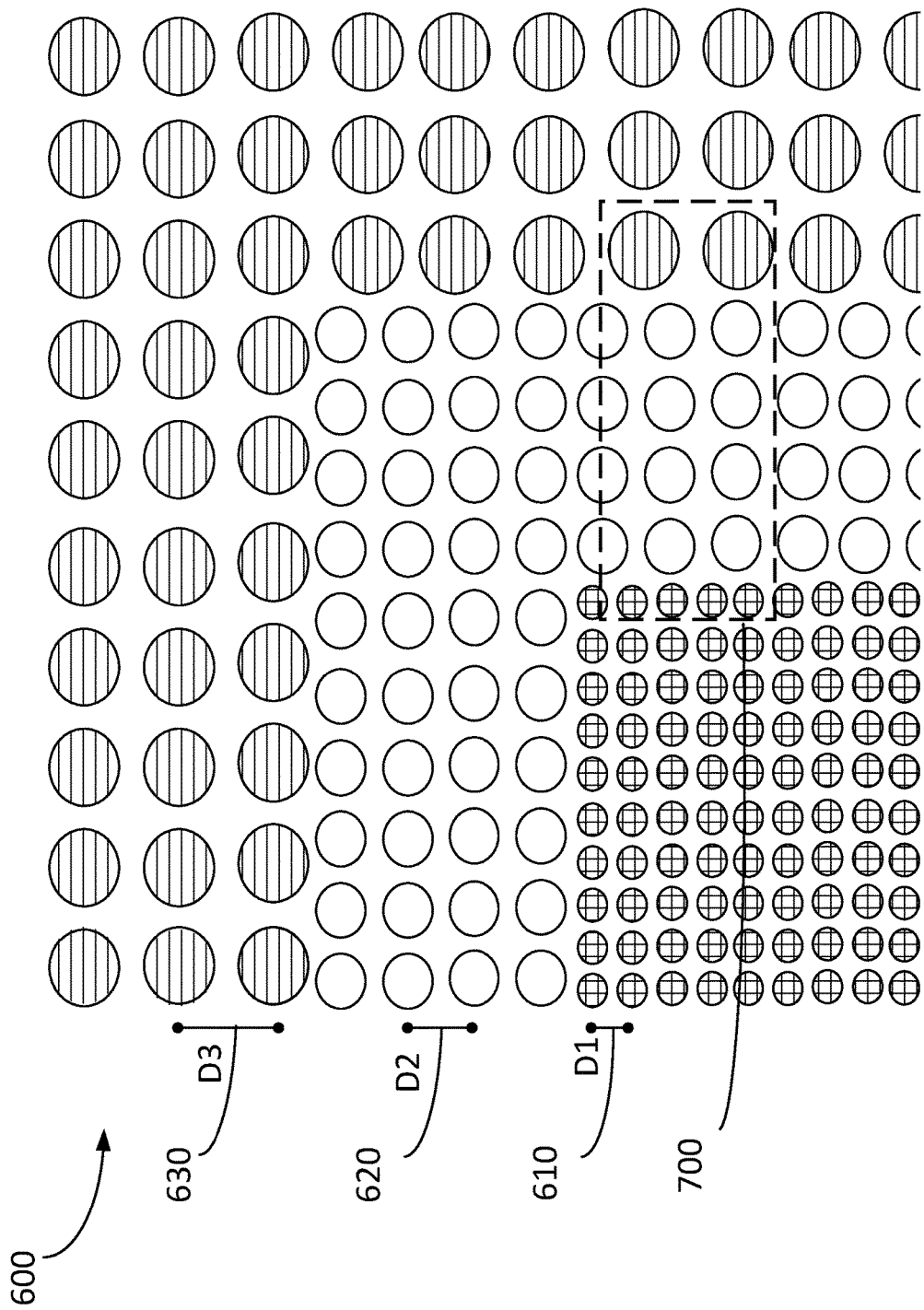
FIG. 6 illustrates an enlarged view of a portion of the display panel shown in FIG. 5 in accordance with some embodiments.

FIG. 6 illustrates an enlarged view of a portion 600 of the display panel 400 shown in FIG. 5 in accordance with some embodiments. The portion 600 shows different densities of light emitters in the first emission region, the second emission region, and the third emission region in accordance with some embodiments.

In FIG. 6, the portion 600 of the display panel 400 includes a portion of the first emission region, a portion of the second emission region, and a portion of the third emission region. For illustration purposes, in FIG. 6, light emitters in the first emission region, the second emission region, and the third emission region are filled with different hatching patterns (e.g., the light emitters in the first emission region are cross-hatched, the light emitters in the second emission region are not hatched, and the light emitters in the third emission region are horizontally hatched).

In some embodiments, a density of light emitters in an emission region is determined from a distance between adjacent (e.g., neighboring) light emitters in the emission region. In some cases, a center-to-center spacing between the adjacent light emitters is deemed to be the distance between the adjacent light emitters. In some cases, an average center-to-center spacing between adjacent light emitters in a particular emission region is deemed to be the distance between the adjacent light emitters. In some cases, an edge-to-edge spacing between the adjacent light emitters is deemed to be the distance between the adjacent light emitters. As shown in FIG. 6, two light emitters, that are adjacent to each other, in the first emission region are spaced apart by a first distance 610 (e.g., a first distance D1) and two light emitters, that are adjacent to each other, in the second emission region are spaced apart by a second distance 620 (e.g., a second distance D2) that is greater than the first distance 610. Two light emitters, that are adjacent to each other, in the third emission region are spaced apart by a third distance 630 (e.g., a third distance D3) that is greater than the second distance 620. As shown in FIG. 6, the first emission region has a higher density of light emitters than the second emission region, and the second emission region has a higher density of light emitters than the third emission region.

Figure 7:
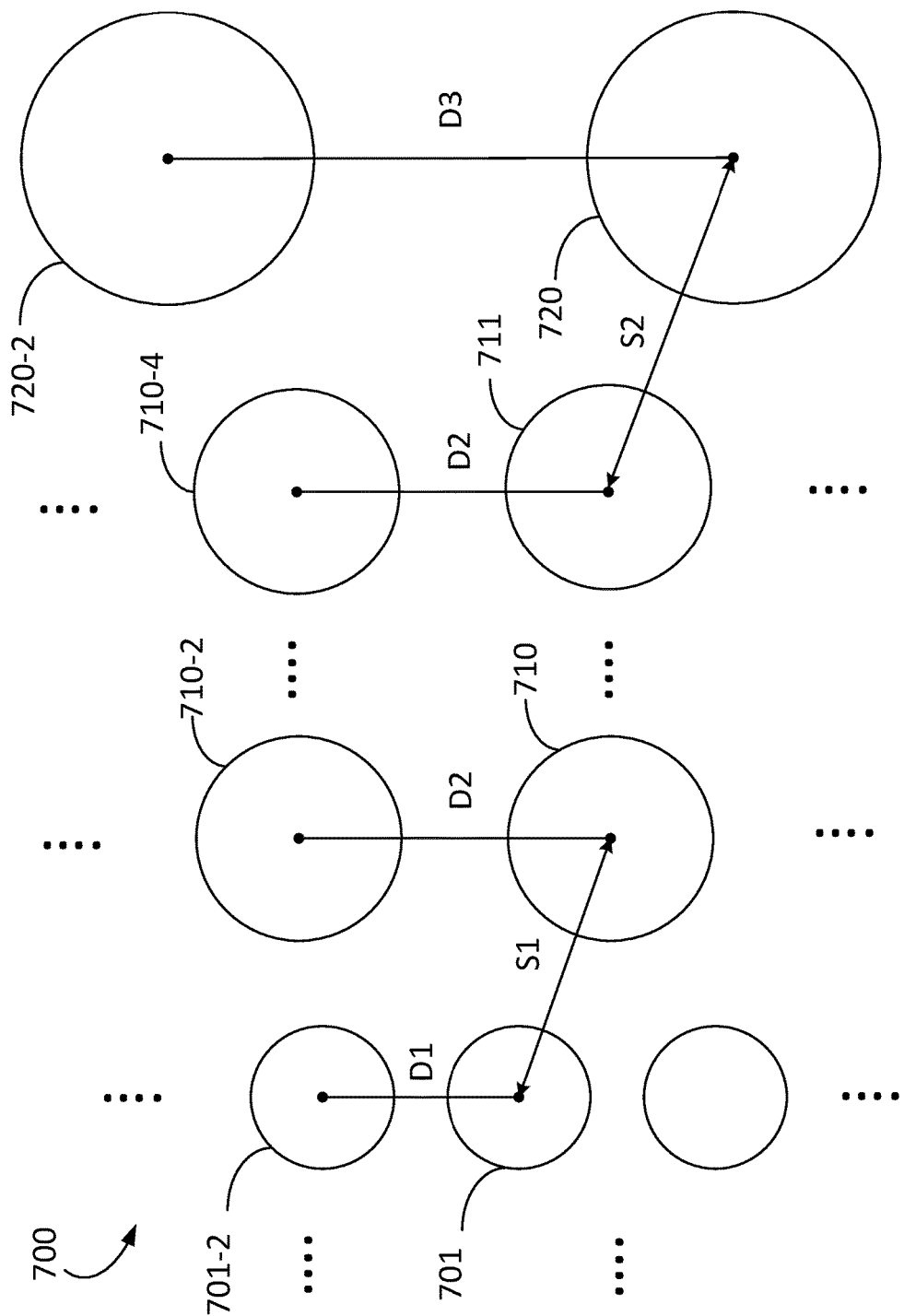
FIG. 7 illustrates an enlarged view of a portion of the display panel shown in FIG. 5 in accordance with some embodiments.

A box 700 illustrated in FIG. 6 indicates a portion of the display panel 400 that is shown in detail in FIG. 7.

FIG. 7 illustrates an enlarged view of a portion 700 of the display panel 400 shown in FIG. 5 in accordance with some embodiments. The portion 700 shows a distance between adjacent light emitters in the first emission region, a distance between adjacent light emitters in the second emission region, and a distance between adjacent light emitters in the third emission region.

In FIG. 7, the first emission region includes a light emitter 701-1 that is adjacent to a neighboring light emitter 701-2 in the first emission region. The light emitter 701-1 is located adjacent to the second emission region (e.g., the light emitter 701-1 is located adjacent to a border between the first emission region and the second emission region) and, in particular, a light emitter 710-1 in the second emission region. The light emitter 710-1 is located adjacent to the first emission region (e.g., the light emitter 710-1 is located adjacent to the border between the first emission region and the second emission region) and, in particular, the light emitter 701-1.

The display panel also includes a light emitter 710-3 that is adjacent to a neighboring light emitter 710-4 in the second emission region. The light emitter 710-3 is located adjacent to the third emission region (e.g., the light emitter 710-3 is located adjacent to a border between the second emission region and the third emission region) and, in particular, a light emitter 720-1 in the third emission region. The light emitter 720-1 is located adjacent to the second emission region (e.g., the light emitter 720-1 is located adjacent to the border between the second emission region and the third emission region) and, in particular, the light emitter 710-3.

In FIG. 7, the light emitter 701-1 is spaced apart from the neighboring light emitter 701-2 in the first emission region by the first distance D1 and the second light emitter 710-1 is spaced apart from the neighboring light emitter 710-2 in the second emission region by the second distance D2. The light emitter 701-1 is spaced apart from the light emitter 710-1 by a distance S1. In some embodiments, the distance S1 is at most the second distance D2 (e.g., the distance S1 is equal to, or less than, the second distance D2).

In FIG. 7, the light emitter 710-3 is spaced apart from the neighboring light emitter 710-4 in the second emission region by the second distance D2 and the light emitter 720-1 is spaced apart from the neighboring light emitter 720-2 in the third emission region by the third distance D3. The light emitter 710-3 is spaced apart from the light emitter 720-1 by a distance S2. In some embodiments, the distance S2 is at most the third distance D3 (e.g., the distance S2 is equal to, or less than, the third distance D3).

In FIG. 7, some light emitters in each emission region are omitted so as not to obscure other aspects of these emission regions and light emitters located therein.

Figure 8:
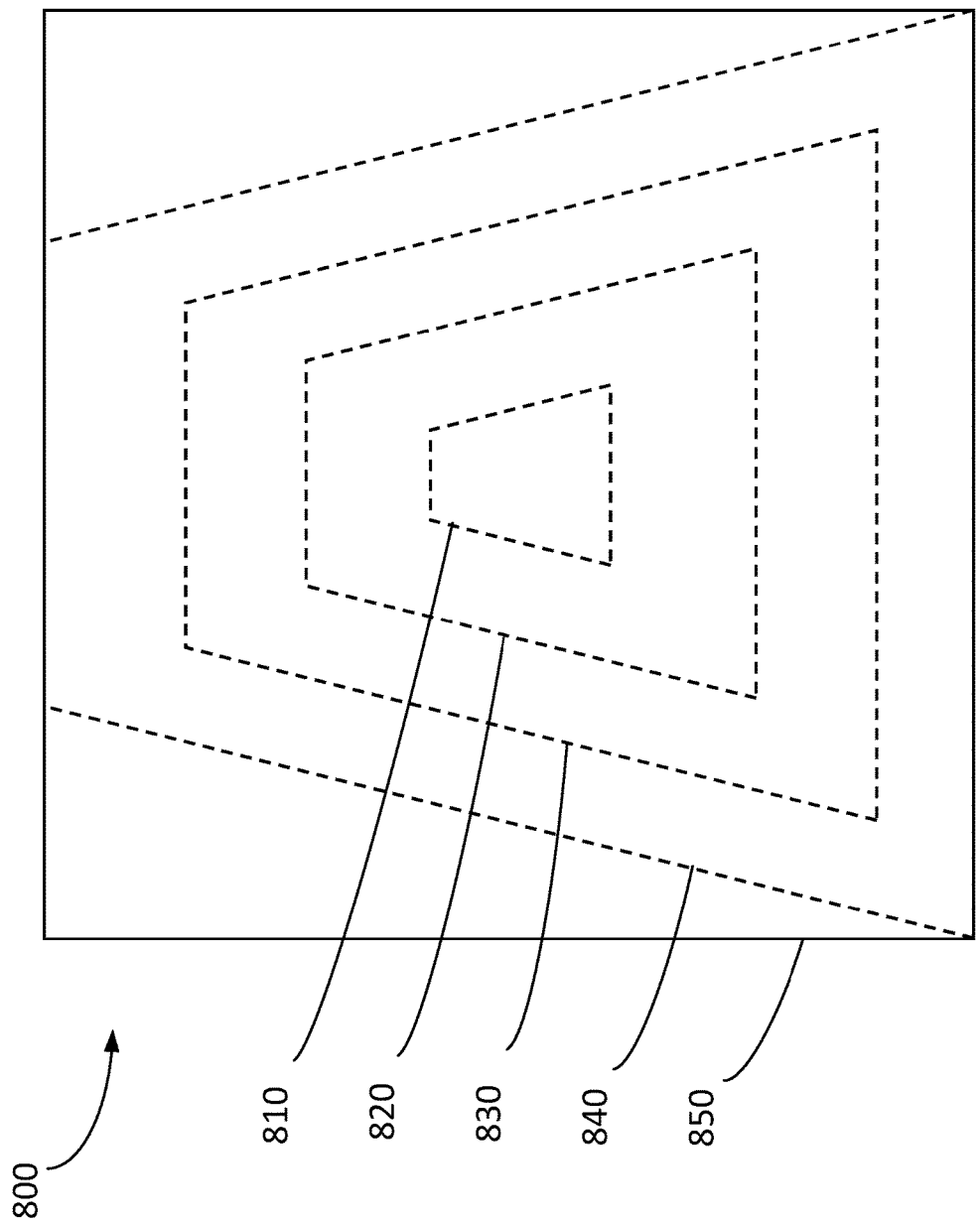
FIG. 8 illustrates a display panel in accordance with some embodiments.

FIG. 8 illustrates a display panel 800 in accordance with some embodiments. The display panel 800 coupled with a circuit board 850 includes a first emission region 810, a second emission region 820, a third emission region 830, and a fourth emission region 840.

The display panel 800 shown in FIG. 8 is similar to the display panel 400 described with respect to FIG. 4 except for a shape of each emission region. For brevity, the detailed descriptions of the emission regions described above with respect to FIGS. 4-7 are not repeated herein.

In FIG. 8, emission regions are configured (e.g., shaped) to compensate (partially or completely) for distortions created by display optics, such as field distortions (e.g., a keystone effect). For example, a keystone effect makes one edge of an image to appear longer than an opposing edge of the image (e.g., a rectangular area appears as a trapezoid).

In some embodiments, one or more emission regions of emission regions have trapezoidal shapes. For example, when the keystone effect associated with the display optics of a display device makes a top edge of an image appear longer than a bottom edge of the image, the display panel 800 shown in FIG. 8, in which each emission region has a shape of a trapezoid having a top edge shorter than a bottom edge, is used to compensate for the keystone effect caused by the display optics. When the keystone effect associated with the display optics of the display device makes the top edge of an image appear shorter than the bottom edge of the image, a display panel, in which each emission region has a shape of a trapezoid having a top edge longer than a bottom edge, is used to compensate for the keystone effect caused by the display optics. In some embodiments, one or more regions of the display panel outside the emission region 840 are turned off (e.g., no light is emitted from the one or more regions of the display panel outside the emission region 840). In some embodiments, one or more regions of the display panel outside the emission region 840 are configured to emit a light of a particular color (e.g., the one or more regions of the display panel outside the emission region 840 provide a monochrome ambient light).

In some other embodiments, one or more emission regions have any other shapes (e.g., circles, triangles, squares, rectangles, and/or ellipses, etc.). In some embodiments, each of the plurality of emission regions has a same shape (of different sizes). In some embodiments, each of the plurality of emission regions has a unique different shape (e.g., the plurality of emission regions has different shapes). In some embodiments, the plurality of emission regions has only a single line of symmetry (e.g., trapezoids, eccentric circles, etc.) or two orthogonal lines of symmetry (e.g., concentric circles, squares, rectangles, ellipses, etc.). In some embodiments, at least one or more emission regions of the plurality of emission regions each have multiple non-orthogonal lines of symmetry (e.g., non-rectangular polygons). In some embodiments, at least one or more emission regions of the plurality of emission regions each have a shape having no lines of symmetry (e.g., a skewed trapezoid).

In some embodiments, one or more display panels described with respect to FIGS. 4-8 are included in a display device (e.g., the display panel is optically coupled with one or more lenses, as shown in FIG. 3). In some embodiments, the display device is a head-mounted display device.

Figure 9:
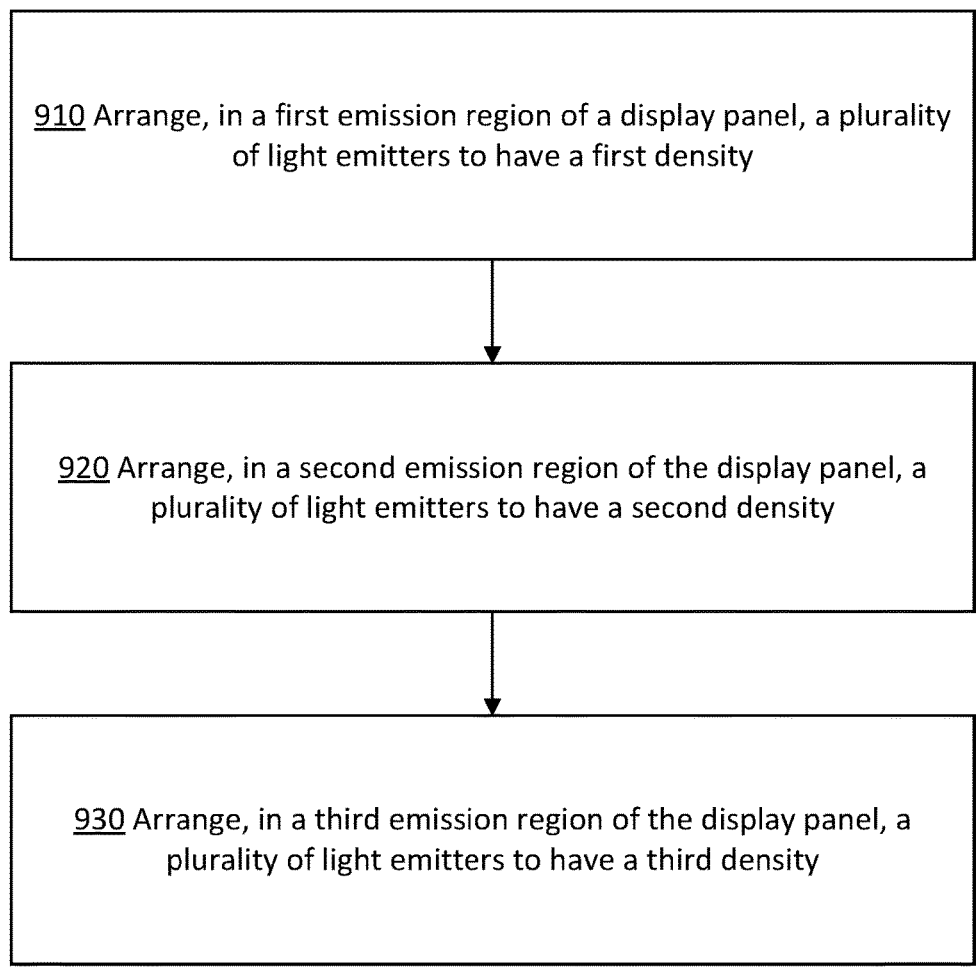
FIG. 9 is a flow diagram illustrating a method for making a display panel in accordance with some embodiments.

FIG. 9 is a flow diagram illustrating a method for making a display panel in accordance with some embodiments.

The method illustrated in FIG. 9 includes operations 910, 920 and 930.

In operation 910, a plurality of light emitters is arranged in a first emission region (e.g., the first emission region 410 in FIG. 4 and the first emission region 810 in FIG. 8) of a display panel to have a first density. In some embodiments, arranging the plurality of light emitters in the first emission region includes forming (e.g., fabricating) the plurality of light emitters in the first emission region. In some embodiments, arranging the plurality of light emitters in the first emission region includes placing (e.g., picking and placing) the plurality of light emitters in the first emission region.

In operation 920, a plurality of light emitters is arranged in a second emission region (e.g., the second emission region 420 in FIG. 4 and the second emission region 820 in FIG. 8) of the display panel to have a second density. The second density is less than the first density. In some embodiments, arranging the plurality of light emitters in the second emission region includes forming (e.g., fabricating) the plurality of light emitters in the second emission region. In some embodiments, arranging the plurality of light emitters in the second emission region includes placing (e.g., picking and placing) the plurality of light emitters in the second emission region.

In operation 930, a plurality of light emitters is arranged in a third emission region (e.g., the third emission region 430 in FIG. 4 and the third emission region 830 in FIG. 8) of the display panel to have a third density. The third density is less than the second density. In some embodiments, arranging the plurality of light emitters in the third emission region includes forming (e.g., fabricating) the plurality of light emitters in the third emission region. In some embodiments, arranging the plurality of light emitters in the third emission region includes placing (e.g., picking and placing) the plurality of light emitters in the third emission region.

The first emission region is surrounded by a second emission region of the display panel that is distinct from and mutually exclusive to the first emission region as described above with respect to FIGS. 4-8.

The second emission region is surrounded by a third emission region of the display panel that is distinct from and mutually exclusive to the second emission region as described above with respect to FIGS. 4-8.

In some embodiments, the third emission region is surrounded by additional emission regions of the display panel that is distinct from and mutually exclusive to the third emission region as described above with respect to FIGS. 4-8.

Respective light emitters of the plurality of light emitters for the first emission region, the second emission region, and the third emission region are configured to emit light.

In some embodiments, the method includes additional operations not shown in FIG. 9. In some embodiments, the method includes a subset, less than all, of the operations 910, 920, and 930. Although FIG. 9 illustrates a particular order of operations, in some embodiments, these operations are performed in a different order (e.g., operation 910, followed by operation 930 and operation 920; operation 910 followed by operation 930 and operation 920; operation 920 followed by operation 910 and operation 930; operation 930 followed by operation 910 and operation 930, etc.).

FIG. 10 is a flow diagram illustrating a method for making a display panel in accordance with some embodiments.

The method illustrated in FIG. 10 includes an operation 1010.

In operation 1010, a plurality of light emitters is arranged in a first emission region, a second emission region, and a third emission region of a display panel (e.g., the display panel 400 in FIG. 4 and the display panel 800 in FIG. 8). In some embodiments, arranging the plurality of light emitters in the first emission region, the second emission region, and the third emission region includes placing (e.g., picking and placing) the plurality of light emitters in the first emission region, the second emission region, and the third emission region. In some embodiments, the display panel has one or more emission regions (e.g., the fourth emission region as described above with respect to FIGS. 4-8) outside the third emission region.

As described above with respect to FIGS. 4-8, the first emission region is surrounded by the second emission region that is distinct from and mutually exclusive to the first emission region. As described above with respect to FIGS. 4-8, the second emission region is surrounded by the third emission region that is distinct from and mutually exclusive to the first emission region and the second emission region. In some embodiments, the third emission region is surrounded by the fourth emission region that is distinct from and mutually exclusive to the first emission region, the second emission region, and the third emission region as described above with respect to FIGS. 4-8.

Respective light emitters of the plurality of light emitters for the first emission region, the second emission region, and the third emission region configured to emit light.

As described above with respect to FIGS. 4-8, the first emission region has a first density of light emitters. As described above with respect to FIGS. 4-8, the second emission region has a second density of light emitters that is less than the first density. As described above with respect to FIGS. 4-8, the third emission region has a third density of light emitters that is less than the second density. In some embodiments, the fourth emission region has a fourth density of light emitters that is less than the third density as described above with respect to FIGS. 4-8.

In light of these principles, we turn to certain embodiments.

In accordance with some embodiments, a display device includes a display panel that has a first emission region (e.g., emission region 410 in FIG. 4), a second emission region (e.g., emission region 420) that is distinct from and mutually exclusive to the first emission region and a third emission region (e.g., emission region 430) is distinct from and mutually exclusive to the first emission region and the second emission region. The first emission region is surrounded by the second emission region and the second emission region is surrounded by the third emission region. The display panel includes a plurality of light emitters arranged in the first emission region, the second emission region, and the third emission region (e.g., FIG. 5). Respective light emitters of the plurality of light emitters are configured to emit light. The first emission region has a first density of light emitters, the second emission region has a second density of light emitters that is less than the first density and the third emission region has a third density of light emitters that is less than the second density (e.g., FIG. 5).

In some embodiments, the plurality of light emitters is individually addressable. For example, each light emitter in the first emission region, the second emission region, and the third emission region can be individually turned on or off (or activated or deactivated) independent of whether other light emitters in the first emission region, the second emission region, and the third emission region are turned on or off (or activated or deactivated).

In some embodiments, the first density is at least 50% higher than the second density. In some embodiments, the first density is at least 75% higher than the second density. In some embodiments, the first density is at least 100% higher than the second density.

In some embodiments, the second density is at least 50% higher than the third density. In some embodiments, the second density is at least 75% higher than the third density. In some embodiments, the second density is at least 100% higher than the third density.

In some embodiments, the display panel has a plurality of emission regions, including the first emission region, the second emission region, the third emission region, and one or more additional emission regions (e.g., the fourth emission region 440 shown in FIG. 4). For any pair of emission regions selected from the plurality of emission regions, an inner emission region of the pair of emission regions, surrounded by an outer emission region, has a density of light emitters that is higher than a density of light emitters of the outer emission region of the pair of emission regions (e.g., FIG. 5).

In some embodiments, each of the plurality of light emitters has a same emission area (e.g., a light emitter in the first emission region has the same emission area as a light emitter in the second emission region and a light emitter in the third emission region).

In some embodiments, a light emitter in the inner region has an emission area that is smaller than an emission area of a light emitter in the outer region.

In some embodiments, an emission area of a light emitter in the first emission region is less than 50% of an emission area of a light emitter in the second emission region. In some embodiments, an emission area of a light emitter in the first emission region is less than 20% of an emission area of a light emitter in the second emission region. In some embodiments, an emission area of a light emitter in the first emission region is less than 10% of an emission area of a light emitter in the second emission region. In some embodiments, an emission area of a light emitter in the first emission region is less than 5% of an emission area of a light emitter in the second emission region.

In some embodiments, an emission area of a light emitter in the second emission region is less than 50% of an emission area of a light emitter in the third emission region. In some embodiments, an emission area of a light emitter in the second emission region is less than 20% of an emission area of a light emitter in the third emission region. In some embodiments, an emission area of a light emitter in the second emission region is less than 10% of an emission area of a light emitter in the third emission region. In some embodiments, an emission area of a light emitter in the second emission region is less than 5% of an emission area of a light emitter in the third emission region.

In some embodiments, an emission area of a light emitter in the first emission region is less than 50% of an emission area of a light emitter in the third emission region. In some embodiments, an emission area of a light emitter in the first emission region is less than 20% of an emission area of a light emitter in the third emission region. In some embodiments, an emission area of a light emitter in the first emission region is less than 10% of an emission area of a light emitter in the third emission region. In some embodiments, an emission area of a light emitter in the first emission region is less than 5% of an emission area of a light emitter in the third emission region.

In some embodiments, two light emitters (e.g., the light emitters 701-1 and 701-2 in FIG. 7), that are adjacent to each other, in the first emission region are spaced apart from each other by a first distance (e.g., the distance D1) and two light emitters (e.g., the light emitters 710-1 and 710-2), that are adjacent to each other, in the second emission region are spaced apart from each other by a second distance (e.g., the distance D2) that is greater than the first distance. In some embodiments, two light emitters (e.g., the light emitters 720-1 and 720-2), that are adjacent to each other, in the third emission region are spaced apart from each other by a third distance (e.g., the distance D3) that is greater than the second distance.

In some embodiments, a first light emitter in the first emission region and a second light emitter in the second emission region are spaced apart by at most the second distance (e.g., the distance between the light emitter 701-1 and the light emitter 710-1 is the distance D2 or less). The first light emitter (e.g., the light emitter 701-1) is located adjacent to the second emission region and the second light emitter (e.g., the light emitter 710-1). The second light emitter is located adjacent to the first emission region and the first light emitter. A third light emitter in the second emission region and a fourth light emitter in the third emission region are spaced apart by at most the third distance (e.g., the distance between the light emitter 710-3 and the light emitter 720-1 is the distance D3 or less). The third light emitter (e.g., the light emitter 710-3) is located adjacent to the third emission region and the fourth light emitter (e.g., the light emitter 720-1). The fourth light emitter is located adjacent to the second emission region and the third light emitter.

In accordance with some embodiments, a light emitter in the first emission region is smaller than a light emitter in the second emission region and a light emitter in the third emission region (e.g., FIG. 6). In some embodiments, the light emitter in the second emission region is smaller than the light emitter in the third region (e.g., FIG. 6).

In some embodiments, the plurality of light emitters includes micro light emitting diodes (microLEDs). In some embodiments, the mircoLEDs have shaped back reflectors.

In some embodiments, the plurality of light emitters is selected from a group consisting of vertical cavity surface emitting lasers (VCSELs) and superluminescent LEDs (SLEDs).

In some embodiments, a respective light emitter of the plurality of light emitters includes a first sub-pixel corresponding to a first color (e.g., red) and a second sub-pixel, that is distinct from the first sub-pixel, corresponding to a second color (e.g., blue) that is distinct from the first color. In some embodiments, the respective light emitter includes a third sub-pixel, that is distinct from the first sub-pixel and the second sub-pixel, corresponding to a third color (e.g., green) that is distinct from the first color and the second color.

In some embodiments, each of the first emission region, the second emission region, and the third emission region has a trapezoidal shape (e.g., FIG. 8).

In some embodiments, at least one of the first emission region, the second emission region, and the third emission region has a shape having only a single line of symmetry (e.g., a trapezoid) or two orthogonal lines of symmetry (e.g., a circle or a rectangle).

In some embodiments, the second emission region is in contact with the first emission region and the third emission region is in contact with the second emission region (e.g., FIG. 4).

In accordance with some embodiments, a method for making a display panel includes arranging, in a first emission region of the display panel, a plurality of light emitters to have a first density.

The method also includes arranging, in the second emission region, a plurality of light emitters to have a second density.

The method further includes arranging, in the third emission region, a plurality of light emitters to have a third density.

The first emission region is surrounded by a second emission region of the display panel that is distinct from and mutually exclusive to the first emission region.

The second density is less than the first density.

The second emission region is surrounded by a third emission region of the display panel that is distinct from and mutually exclusive to the first emission region and the second emission region.

The third density is less than the second density.

Respective light emitters of the plurality of light emitters for the first emission region, the second emission region, and the third emission region are configured to emit light.

In accordance with some embodiments, a method for making a display panel includes arranging a plurality of light emitters in a first emission region, a second emission region, and a third emission region of a display panel. The first emission region is surrounded by the second emission region that is distinct from and mutually exclusive to the first emission region and the second emission region is surrounded by the third emission region that is distinct from and mutually exclusive to the first emission region and the second emission region. Respective light emitters of the plurality of light emitters for the first emission region, the second emission region, and the third emission region are configured to emit light. The first emission region has a first density of light emitters, the second emission region has a second density of light emitters that is less than the first density and the third emission region has a third density of light emitters that is less than the second density.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A display device, comprising:
   a display panel having:
      a first emission region,
      a second emission region that is distinct from and mutually exclusive to the first emission region, and
      a third emission region that is distinct from and mutually exclusive to the first emission region and the second emission region, wherein:
         the first emission region is surrounded by the second emission region; and
         the second emission region is surrounded by the third emission region; and
   the display panel including a plurality of light emitters arranged in the first emission region, the second emission region, and the third emission region, respective light emitters of the plurality of light emitters configured to emit light, wherein:
      the first emission region has a first density of light emitters;
      the second emission region has a second density of light emitters that is less than the first density;
      the third emission region has a third density of light emitters that is less than the second density; and a respective light emitter of the plurality of light emitters includes a first sub-pixel corresponding to a first color and a second sub-pixel, that is distinct from the first sub-pixel, corresponding to a second color that is distinct from the first color.

2. The device of claim 1, wherein the plurality of light emitters is individually addressable.

3. The device of claim 1, wherein the first density is at least 50% higher than the second density.

4. The device of claim 1, wherein:
the display panel has a plurality of emission regions, including the first emission region, the second emission region, the third emission region, and one or more additional emission regions; and
for any pair of emission regions selected from the plurality of emission regions, an inner emission region of the pair of emission regions has a density of light emitters that is higher than a density of light emitters of an outer emission region of the pair of emission regions, the inner emission region being surrounded by the outer emission region.

5. The device of claim 4, wherein each of the plurality of light emitters has a same emission area.

6. The device of claim 4, wherein:
a light emitter in the inner region has an emission area that is smaller than an emission area of a light emitter in the outer region.

7. The device of claim 6, wherein an emission area of a light emitter in the first emission region is less than 50% of an emission area of a light emitter in the third emission region.

8. The device of claim 1, wherein:
two light emitters, that are adjacent to each other, in the first emission region are spaced apart from each other by a first distance; and
two light emitters, that are adjacent to each other, in the second emission region are spaced apart from each other by a second distance that is greater than the first distance.

9. The device of claim 8, wherein:
two light emitters, that are adjacent to each other, in the third emission region are spaced apart from each other by a third distance that is greater than the second distance.

10. The device of claim 9, wherein:
a first light emitter in the first emission region and a second light emitter in the second emission region are spaced apart by at most the second distance, the first light emitter being located adjacent to the second emission region and the second light emitter, the second light emitter being located adjacent to the first emission region and the first light emitter; and
a third light emitter in the second emission region and a fourth light emitter in the third emission region are spaced apart by at most the third distance, the third light emitter being located adjacent to the third emission region and the fourth light emitter, the fourth light emitter being located adjacent to the second emission region and the third light emitter.

11. The device of claim 1, wherein a light emitter in the first emission region is smaller than a light emitter in the second emission region and a light emitter in the third emission region.

12. The device of claim 11, wherein the light emitter in the second emission region is smaller than the light emitter in the third region.

13. The device of claim 1, wherein the plurality of light emitters includes micro light emitting diodes (microLEDs).

14. The device of claim 13, wherein the microLEDs have shaped back reflectors.

15. The device of claim 1, wherein the plurality of light emitters is selected from a group consisting of vertical cavity surface emitting lasers (VCSELs) and superluminescent LEDs (SLEDs).

16. The device of claim 1, wherein each of the first emission region, the second emission region, and the third emission region has a trapezoidal shape.

17. The device of claim 1, wherein at least one of the first emission region, the second emission region, and the third emission region has a shape having only a single line of symmetry or two orthogonal lines of symmetry.

18. The device of claim 1, wherein:
the second emission region is in contact with the first emission region; and
the third emission region is in contact with the second emission region.

19. A method for making a display panel, the method comprising:
arranging, in a first emission region of the display panel, a plurality of light emitters to have a first density;
arranging, in a second emission region of the display panel, a plurality of light emitters to have a second density; and
arranging, in the third emission region of the display panel, a plurality of light emitters to have a third density, wherein:
the second emission region surrounds the first emission region and is distinct from and mutually exclusive to the first emission region;
the second density is less than the first density;
the third emission region surrounds the second emission region and is distinct from and mutually exclusive to the first emission region and the second emission region;
the third density is less than the second density;
respective light emitters of the plurality of light emitters for the first emission region, the second emission region, and the third emission region are configured to emit light; and
a respective light emitter of the plurality of light emitters includes a first sub-pixel corresponding to a first color and a second sub-pixel, that is distinct from the first sub-pixel, corresponding to a second color that is distinct from the first color.

* * * * *

UNITED STATES PATENT AND TRADEMARK OFFICE
CERTIFICATE OF CORRECTION

PATENT NO. : 10,453,828 B1
APPLICATION NO. : 16/006734
DATED : October 22, 2019
INVENTOR(S) : Ouderkirk et al.

It is certified that error appears in the above-identified patent and that said Letters Patent is hereby corrected as shown below:

In the Claims

Claim 19, Column 22, Line 37, please delete "in the third" and insert --in a third--.

Signed and Sealed this
Thirty-first Day of December, 2019

Andrei Iancu
*Director of the United States Patent and Trademark Office*